United States Patent [19]

Lowden

[11] Patent Number: 5,300,322
[45] Date of Patent: Apr. 5, 1994

[54] MOLYBDENUM ENHANCED LOW-TEMPERATURE DEPOSITION OF CRYSTALLINE SILICON NITRIDE

[75] Inventor: Richard A. Lowden, Powell, Tenn.

[73] Assignee: Martin Marietta Energy Systems, Inc., Oak Ridge, Tenn.

[21] Appl. No.: 849,542

[22] Filed: Mar. 10, 1992

[51] Int. Cl.⁵ .................. C23C 16/34; C23C 16/42
[52] U.S. Cl. .............................. 427/255; 427/255.1
[58] Field of Search ............. 427/255, 255.2, 255.1

[56] References Cited

U.S. PATENT DOCUMENTS

| | | | |
|---|---|---|---|
| 2,920,006 | 1/1960 | Yntema et al. | 148/6.3 |
| 3,117,846 | 1/1964 | Chao | 29/195 |
| 3,373,051 | 3/1968 | Chu et al. | 117/106 |
| 3,477,872 | 11/1969 | Amick | 117/212 |
| 3,814,625 | 6/1974 | Lewin et al. | 117/71 M |
| 3,982,048 | 9/1976 | Zlupko | 427/126 |
| 4,162,345 | 7/1979 | Holzl | 428/328 |
| 4,180,596 | 12/1979 | Crowder et al. | 427/42 |
| 4,279,947 | 7/1981 | Goldman et al. | 427/255.2 |
| 4,359,490 | 11/1982 | Lehrer | 427/95 |
| 4,369,233 | 1/1983 | van Schaik | 428/678 |
| 4,404,235 | 9/1983 | Tarng et al. | 427/89 |
| 4,431,708 | 2/1984 | Carver et al. | 428/641 |
| 4,501,769 | 2/1985 | Hieber et al. | 427/95 |
| 4,535,000 | 8/1985 | Gordon | 427/160 |
| 4,580,524 | 4/1986 | Lackey, Jr. et al. | 427/255.2 |
| 4,598,024 | 7/1986 | Stinton et al. | 428/448 |
| 4,605,566 | 8/1986 | Matsui et al. | 427/43.1 |
| 4,610,896 | 9/1986 | Veltri et al. | 427/140 |
| 4,614,689 | 9/1986 | Ikeda et al. | 428/409 |
| 4,617,237 | 10/1986 | Gupta et al. | 428/446 |
| 4,654,228 | 3/1987 | Komiyama | 427/255.2 |
| 4,684,536 | 8/1987 | Zega | 427/47 |
| 4,699,825 | 10/1987 | Sakai et al. | 427/255.2 |
| 4,713,259 | 12/1987 | Gartner et al. | 427/39 |
| 4,720,395 | 1/1988 | Foster | 427/255 |
| 4,741,925 | 5/1988 | Chaudhuri et al. | 427/231 |
| 4,756,927 | 7/1988 | Black et al. | 427/53.1 |
| 4,758,451 | 7/1988 | van den berg et al. | 427/249 |
| 4,780,372 | 10/1988 | Tracy et al. | 428/428 |
| 4,794,019 | 12/1988 | Miller | 427/124 |
| 4,800,137 | 1/1989 | Okuno et al. | 428/698 |
| 4,803,127 | 2/1989 | Hakim | 428/457 |
| 4,810,530 | 3/1989 | D'Angelo et al. | 427/215 |
| 4,818,626 | 4/1989 | Werdecker et al. | 428/469 |
| 4,820,562 | 4/1989 | Tanaka et al. | 428/34.6 |
| 4,822,697 | 4/1989 | Haluska et al. | 428/698 |
| 4,830,891 | 5/1989 | Nishitani et al. | 427/253 |
| 4,843,040 | 6/1989 | Oda et al. | 501/92 |
| 4,861,623 | 8/1989 | Ueki et al. | 427/69 |
| 4,869,931 | 9/1989 | Hirooka et al. | 427/255.2 |
| 4,876,119 | 10/1989 | Takeda et al. | 427/250 |
| 4,888,142 | 12/1989 | Hayashi et al. | 427/255.2 |
| 4,892,792 | 1/1990 | Sarin et al. | 428/698 |
| 4,911,992 | 3/1990 | Haluska et al. | 428/698 |

FOREIGN PATENT DOCUMENTS 58-176109 10/1983 Japan.

OTHER PUBLICATIONS

Webster's II New Riverside University Dictionary 1984.

A. C. Airey et al, "Pyrolytic Silicon Nitride Coatings," *Proc. Brit. Ceram. Society*, 305-320 (1972-73).

(List continued on next page.)

silicon nitride which comprises the steps of: introducing a mixture of a silicon source, a molybdenum source, a nitrogen source, and a hydrogen source into a vessel containing a suitable substrate; and thermally decomposing the mixture to deposit onto the substrate a coating comprising crystalline silicon nitride containing a dispersion of molybdenum silicide.

10 Claims, 5 Drawing Sheets

OTHER PUBLICATIONS

J. J. Gebhardt et al, "Chemical Vapor Deposition of Silicon Nitride," *J. Electrochem. Soc.*: Solid-State Science and Technology, 1578–1582 (Oct. 1976).

F. Galasso et al, "Pyrolytic $Si_3N_4$," *Journal of the American Ceramic Society-Discussions and Notes*, 431 (Aug. 1972).

T. Hirai et al, "CVD Fabrication of IN-Situ Composite of Non-Oxide Ceramics," *Tailoring Multiphase & Composite Ceram., Proc. 21st Univ. Conf. on Ceram. Sci.*, Penn St. U., Plenum Press, N.Y. 1986.

T. Hirai, "SVD of $Si_3N_4$ and Its Composites," *Emergent Process Meth. for High Tech. Ceram.*, N. Carolina St. U. ed. by R. F. Davis, et al, Plenum Press, N.Y. 1984.

R. A. Tanzilli et al, *Processing Research on Chemically Vapor Deposited Silicon Nitride-Phase 3*, Document #81SDR2111, prepared for Office of Naval Research (Dec. 1981).

*Primary Examiner*—Shrive Beck
*Assistant Examiner*—Bret Chen
*Attorney, Agent, or Firm*—Joseph A. Marasco; Harold W. Adams

[57] ABSTRACT

A process for chemical vapor deposition of crystalline

MOLYBDENUM ENHANCED LOW-TEMPERATURE DEPOSITION OF CRYSTALLINE SILICON NITRIDE

The United States Government has rights in this invention pursuant to contract no. DE-AC05-84OR21400 between the United States Department of Energy and Martin Marietta Energy Systems, Inc.

FIELD OF THE INVENTION

The invention relates to processes for chemical vapor deposition (CVD) of crystalline silicon nitride (usually $Si_3N_4$), and more particularly to such processes which can operate at relatively low temperatures and involve the addition of molybdenum. The invention also relates to compositions containing crystalline silicon nitride and molybdenum silicide.

BACKGROUND OF THE INVENTION

Recent years have seen significant progress in the development of engineered ceramics. These new materials are expected to find uses in structural applications at high temperatures or in other specific areas where metals or polymers are less desirable. Because of the combination of attractive mechanical, thermal, and thermo-mechanical properties, one of the most interesting ceramics is $Si_3N_4$. Silicon nitride can exist in alpha or beta hexagonal structures, the properties of the two differing somewhat. Beta-$Si_3N_4$ ($\beta$-$Si_3N_4$) is preferred because it generally exhibits higher strength, modulus, and hardness. $Si_3N_4$ has high strength at high temperatures, good thermal stress resistance due to its low coefficient of thermal expansion, and high resistance to oxidation when compared to other non-oxides. These properties thus allow $Si_3N_4$ components to be used to higher operating temperatures.

Potential applications for $Si_3N_4$ materials are abundant, including use in combustion system components such as high temperature turbines, combustion chamber liners, rocket nozzles, and thrust deflectors. The low thermal conductivity of $Si_3N_4$ makes it attractive as a thermal barrier, either as a coating or stand-alone component. Its low density allows it to replace superalloys with a 40% weight savings. Silicon nitride's dielectric properties are of interest for use in low observable (stealth) technology.

The conventional method for producing $Si_3N_4$ is via the hot-pressing of powder. Generally, this requires the addition of a sintering aid which lowers the melting temperature at the grain boundaries to permit consolidation. Thus the ultimate utilization temperature of the component is reduced to well below that of pure $Si_3N_4$, preventing full use of the material's advantages. Hot pressing of $Si_3N_4$ with sintering aids such as mixtures of yttria and alumina is typically conducted at temperatures ranging from 1600° C. to 2000° C., usually above 1700° C.

A technique used to produce pure $Si_3N_4$, usually as a coating, is chemical vapor deposition (CVD). In CVD gaseous reactants are caused to flow over a heated substrate where they react, depositing one or more phases, and often producing gaseous byproducts. For $Si_3N_4$ the reactants are typically silanes, chlorosilanes, or chlorides reacted with ammonia.

In the production of $Si_3N_4$ there are distinct advantages to the use of CVD. Crystalline CVD $Si_3N_4$ has demonstrated one-tenth the oxidation rate of hot-pressed material. The density of CVD material is easily near theoretical. CVD also has high throwing power (can uniformly coat surfaces not in the line of sight of the source). The CVD processing temperature for many materials is much lower than that for other production methods. Although CVD is generally used for coatings, it can and has been used to prepare stand-alone bodies of pure material by depositing on a mandrel which is then removed.

A difficulty in the CVD of $Si_3N_4$ is that only amorphous material is deposited below about 1200° C., and near 1200° C. crystalline material is deposited at only very low deposition rates (5 um/h). Increasing the deposition rate via increased reactant flow quickly causes the deposit to be amorphous. The only exception is the deposition from highly dilute silane and ammonia, which deposits polycrystalline $Si_3N_4$ at 1100° C. at relatively low rates (<10 um/h). Attempts to crystallize deposited amorphous coatings at 1500° C. results in the coating disintegrating to a fine powder.

Unfortunately, amorphous $Si_3N_4$ is not desirable for most engineering applications. Deposited amorphous coatings greater than 1 um in thickness are heavily microcracked. Amorphous material also tends to retain contaminants that result from processing (e.g., HCl).

Another technique which utilizes CVD to prepare ceramic bodies is chemical vapor infiltration (CVI). In CVI the vapor phase reactants are caused to diffuse or flow through a porous preform where they deposit material on the contacted surfaces, filling the void space and forming a composite material. The preform is typically fibrous, allowing a fiber-reinforced composite to be produced at relatively low temperatures and without causing damaging stress to the fibers. This technique has been successfully used to produce amorphous $Si_3N_4$ matrix-fiber reinforced material. Again, because of the amorphous nature of the matrix, the composite is of low strength (about one-half that of similar SiC-matrix material), and retains significant amounts of HCl, which causes chemical instability.

Raising the CVI processing temperature to at least 1300° C. could form crystalline $Si_3N_4$. However, this is not feasible for CVI. At such high temperatures the rate of deposition, which is governed by the exponential Arrhenius relation, is too high for effective infiltration to occur. Deposition tends to occur at the outer surface, eventually sealing the porosity thereof and creating a steep density gradient between the entrance surface and the center of the preform. In addition, many of the types of ceramic fibers used for CVI processing suffer substantial degradation at temperatures much in excess of 1100° C., The deposition temperature for crystalline $Si_3N_4$ has been reduced, and/or the physical, chemical, and mechanical properties of the deposit have been altered by the addition of dopants or contaminants. One approach was the addition of titanium in the form of titanium nitride. Titanium tetrachloride was added to a $SiCl_4$—$NH_3$—$H_2$ reaction to produce a crystalline $Si_3N_4$ coating with a dispersed TiN second phase. The deposition temperatures for the crystalline material were at least 1250° C. At 1250° C., alpha-type $Si_3N_4$ was deposited, and at temperatures greater than 1400° C., $\beta$-$Si_3N_4$ was produced. The materials were developed for improved thermal and electrical conductivity. TiN, however, degrades the corrosion/oxidation resistance properties of the $Si_3N_4$ base material. Also, the deposition temperature for the preferred $\beta$-$Si_3N_4$ is still above the decomposition temperature of many otherwise suitable substrates such as silicon, nickel, nickel-based alloys, and many ceramic fibers. Examples of ceramic fibers are: Nicalon, a trade name for a Si—C—O manufactured by Nippon Carbon Co., Tokyo, Japan; Nextel, a trade name for Al—Si—B—O manufactured by 3M Corp., St. Paul, Minn.; and HPZ, a trade name for Si—N—C—O manufactured by Dow-Corning, Midland, Mich.

There is a need for a second phase material which improves chemical resistance, lowers the deposition temperature for crystalline material, especially that which contains $\beta$-$Si_3N_4$, and also provides a $Si_3N_4$ coating with exceptional oxidation/corrosion resistance and chemical inertness.

For further information, the following documents are referenced, and the disclosure of each is expressly incorporated herein by reference:

1. R. A. Tanzilli, et al., "Processing Research on Chemically Vapor Deposited Silicon Nitride—Phase 3", Document No. 81SDR2111, final technical report prepared under contract No. N0014-78-C-0107 for the Office of Naval Research, (1981).

2. T. Hirai, "CVD of $Si_3N_4$ and Its Composites," pp. 329-345 in *Emergent Process Methods for High Technology Ceramics*, North Carolina State University, Ed. R. F. Davis, H. Palmour III, and R. L. Porter, Plenum Press, N.Y. (1984).

3. T. Hirai, et al., "CVD Fabrication of In-situ Composites of Non-oxide Ceramics," *Tailoring Multiphase and Composite Ceramics*, Proceedings of the Twenty-first University Conference on Ceramic Science, p. 165-178, Pennsylvania State University, Plenum Press, New York (1986).

4. F. Galasso, et al., "Pyrolytic $Si_3N_4$," *J. Am. Ceram. Soc.* 55(8), 431 (1972).

5. J. J. Gebhardt, et al., "Chemical Vapor Deposition of Silicon Nitride," *J. Electrochem. Soc.*: Solid-State Science and Technology 123(10), 1578-1582 (1976).

6. A. C. Airey, et al., "Pyrolytic Silicon Nitride Coatings," *Proc. Brit. Ceram Soc.* 22, 305-320 (1972).

7. U.S. Pat. No. 4,598,024.

8. U.S. Pat. No. 4,580,524.

OBJECTS OF THE INVENTION

Accordingly, it is an object of the present invention to provide a new and improved method for producing a crystalline $Si_3N_4$ material with exceptional oxidation/corrosion resistance and chemical inertness.

It is also an object of the present invention to provide a new and improved method for producing a crystalline $Si_3N_4$ coating on substrates that cannot withstand the high temperatures required by conventional deposition methods.

It is another object of the present invention to provide a new and improved CVD method for producing a crystalline silicon nitride coating at lower temperatures, while maintaining acceptable deposition rates.

It is another object of the present invention to provide a new and improved CVI method for producing a ceramic article comprising a porous ceramic material having deposited within the pores thereof a crystalline nitride of silicon having a silicide of molybdenum dispersed therein.

Further and other objects of the present invention will become apparent from the description contained herein.

SUMMARY OF THE INVENTION

In accordance with one aspect of the present invention, the foregoing and other objects are achieved by a process for chemical vapor deposition of crystalline silicon nitride which comprises the steps of:

introducing a mixture of a silicon source, a molybdenum source, a nitrogen source, and a hydrogen source into a vessel containing a suitable substrate; and, thermally decomposing the mixture to deposit onto the substrate a coating comprising a crystalline nitride of silicon containing a dispersion of a silicide of molybdenum.

In accordance with another aspect of the present invention, a composition of matter comprises a crystalline nitride of silicon containing a dispersion of a silicide of molybdenum.

In accordance with a further aspect of the present invention, a coated article comprises a substrate having thereon a coating which comprises a crystalline nitride of silicon containing a dispersion of a silicide of molybdenum.

In accordance with a still further aspect of the present invention, a composite material comprises a porous ceramic material having deposited within the pores thereof a crystalline nitride of silicon having a silicide of molybdenum dispersed therein.

For a better understanding of the present invention, together with other and further objects, advantages and capabilities thereof, reference is made to the following disclosure and appended claims in connection with the above-described drawings.

DETAILED DESCRIPTION OF THE INVENTION

The addition of a source of molybdenum such as $MoCl_5$ during the deposition of $Si_3N_4$ from gaseous mixtures such as $SiCl_4$—$NH_3$—$H_2$ produces crystalline $Si_3N_4$ having therein a dispersion of molybdenum silicide. Deposition of the material is usually practical at temperatures from about 1000° C. to about 1500° C. The molybdenum silicide is usually comprised of at least one of: $MoSi_2$, $Mo_5Si_3$, and $Mo_3Si$, the most common form being $MoSi_2$.

Preferred silicon sources include silanes such as SiH$_4$, chlorosilanes such as SiH$_x$Cl$_{4-x}$, and silicon chlorides, especially silicon tetrachloride (SiCl$_4$). Preferred molybdenum sources include Molybdenum-containing organometallic compositions, molybdenum halides such as molybdenum hexafluoride (MoF$_6$), and especially molybdenum pentachloride (MoCl$_5$). Preferred nitrogen sources include nitrogen gas (N$_2$), and especially ammonia (NH$_3$). The preferred hydrogen source is hydrogen gas (H$_2$). The term "source", as employed herein, defines compositions that are introduced in gas or vapor form into a CVD process for participation therein.

Mechanical, chemical, and physical properties of the coatings are greatly enhanced when a source of molybdenum is added to the CVD process. For example, the fracture toughness of the Si$_3$N$_4$ is increased, its oxidation resistance is enhanced, and its thermal expansion characteristics are modified. The addition of a Mo-phase was found to significantly improve the coating performance. It was also discovered that the co-deposition of MoSi$_2$ resulted in the formation of $\beta$-Si$_3$N$_4$ and $\alpha + \beta$-Si$_3$N$_4$ at rates approaching 200 um/h at $\approx$1150° C.

Molybdenum pentachloride, MoCl$_5$, the preferred Mo-source, is a solid at room temperature and can generally be sublimated at temperatures of $\approx$265° C. at reduced pressure. In the preferred process, direct chlorination of molybdenum is used to produce MoCl$_5$ within the CVD apparatus.

Figure 1:
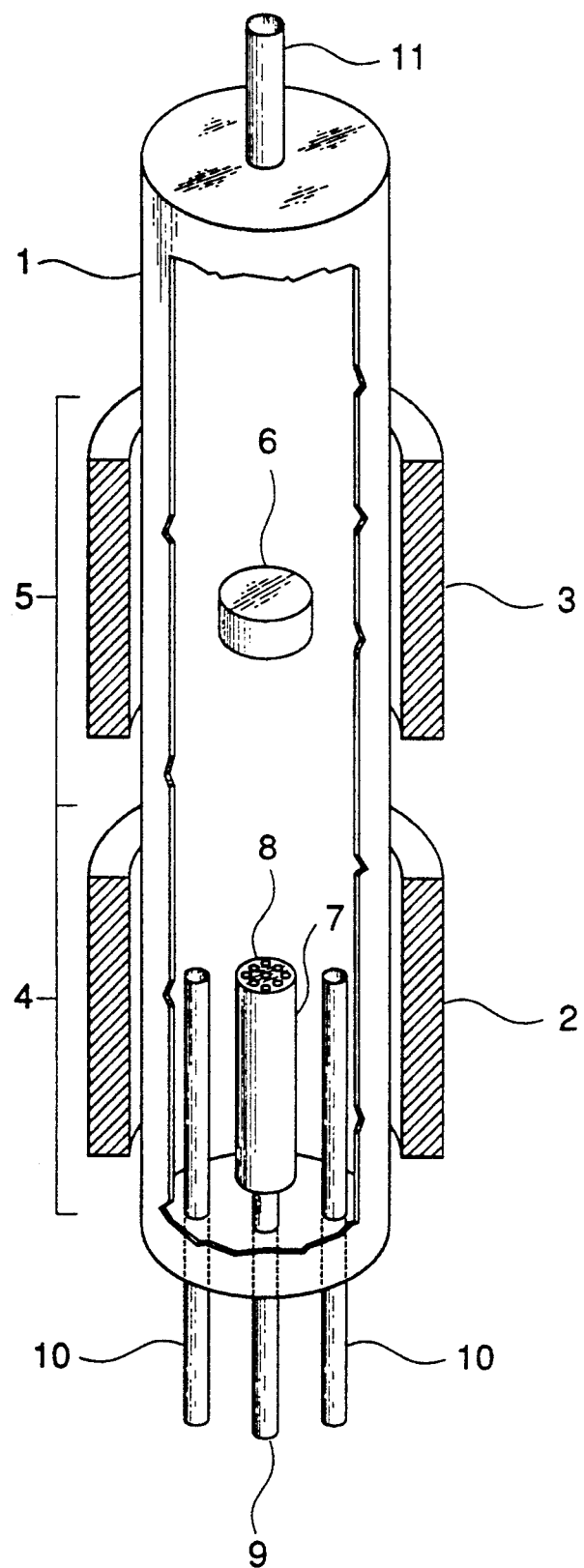
FIG. 1 is a schematic cutaway view of a suitable CVD chamber for carrying out a process according to the invention.

Referring now to FIG. 1, in a typical CVD system, a quartz, nickel, or stainless steel coldwall reactor vessel 1 is utilized for the preferred process. Two heating means 2, 3 control the temperature of the reaction region 4 and the deposition region 5, respectively. Preferably, the first heating means 2, for heating the reaction region 4 is a resistance furnace, and the second heating means 3, for heating the deposition region 5 is an RF heating coil. A suitable substrate 6 is supported in the deposition region 5.

A halide generator 7, comprised of a chamber having a perforated end 8, and made of quartz, nickel, or stainless steel, is located in the reaction region 4. Molybdenum metal in the form of chips, pellets, wire, foil, shot, etc. is contained inside the generator. Molybdenum shot of a nominal 2-5 mm diameter is usually quite suitable. A suitable source of gaseous halogen is connected to the generator 7 through a tubing inlet 9. The preferred halogen source is Cl$_2$ or HCl. Fluorine, HF, and other similar halide containing gases are also suitable.

The reaction region 4 and the halide generator 7 are heated to a sufficient temperature for the molybdenum particles to react with the halogen, usually about 300° C. The temperature and halogen flow are controlled in order to produce the molybdenum halide at the desired rate.

Other gas inlets 10 are provided for introducing gaseous or vaporous silicon, nitrogen, and hydrogen sources. An outlet 11 is provided for exhaust. A typical CVD system usually has connected thereto conventional devices for controlling various parameters. Devices such as plumbing, valves, pressure regulators, mass flow controllers, gas filters and scrubbers, power supplies, and the like are well known, and can be employed herein as necessary, in any convenient configuration.

EXAMPLE I

Figure 2:
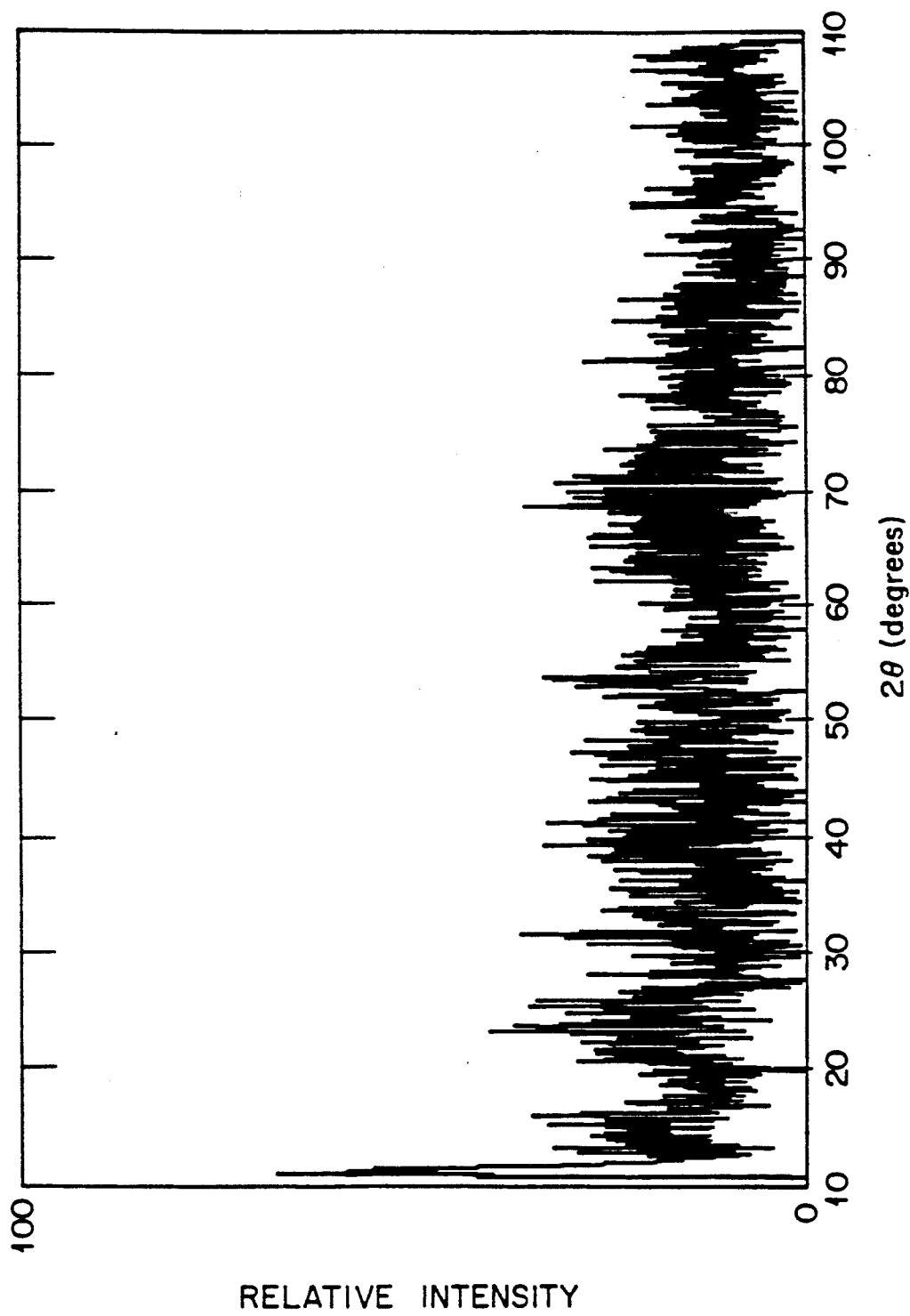
FIG. 2 is a graph showing an X-ray diffraction pattern for amorphous $Si_3N_4$ deposited from a gas mixture comprised of 40 cm$^3$/min. $SiCl_4$, 160 cm$^3$/min. $NH_3$, and $\sim$1000 cm$^3$/min. $H_2$, with no $MoCl_5$ additions.
Figure 3:
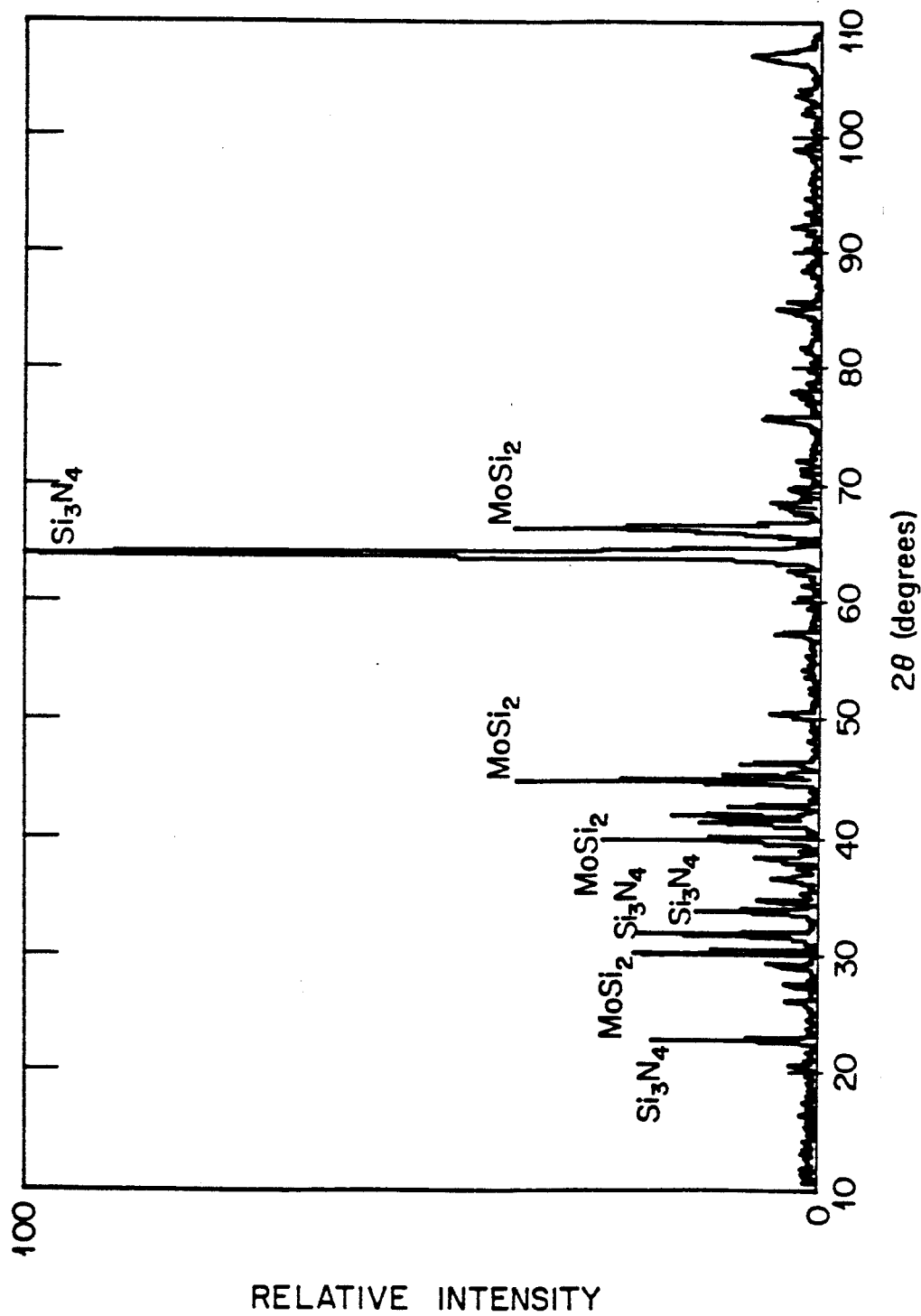
FIG. 3 is a graph showing an X-ray diffraction pattern for $Si_3N_4$ deposited, according to the subject process, from a gas mixture comprised of 40 cm$^3$/min. $SiCl_4$, 160 cm$^3$/min. $NH_3$, and $\sim$1000 cm$^3$/min. $H_2$, and 5 cm$^3$/min. $MoCl_5$.

In a CVD system as described above, MoCl$_5$ was introduced during an otherwise typical Si$_3$N$_4$ deposition onto a graphite substrate, at a temperature of about 1200° C. and a pressure of 3.3 kPa. The gas mixture in the deposition region was comprised of 40 cm$^3$/min. SiCl$_4$, 160 cm$^3$/min. NH$_3$, and ~1000 cm$^3$/min. H$_2$, and 5 cm$^2$/min. MoCl$_5$. A control substrate was coated under the same conditions, but with no MoCl$_5$ being introduced thereto. X-ray diffraction analysis of the coatings that were produced showed the deposit on the control substrate to be amorphous silicon nitride, and the deposit on the experimental substrate to be predominantly crystalline $\beta$-Si$_3$N$_4$ with a MoSi$_2$ second phase dispersed therein. These results are shown graphically in FIGS. 2 and 3.

EXAMPLE II

Figure 4:
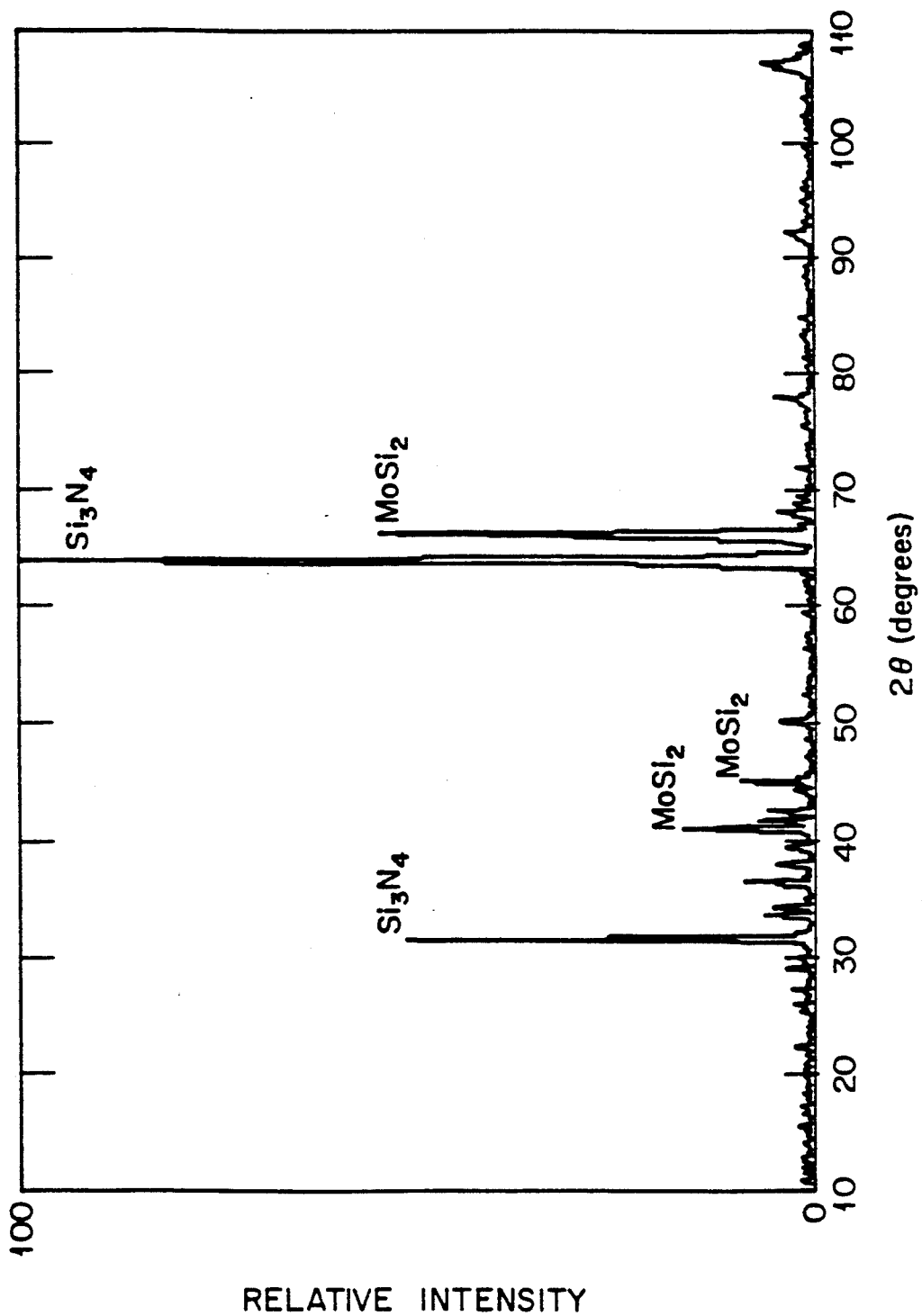
FIG. 4 is a graph showing an X-ray diffraction pattern for $Si_3N_4$ deposited, according to the subject process, from a gas mixture comprised of 40 cm$^3$/min. $SiCl_4$, 160 cm$^3$/min. $NH_3$, and $\sim$1000 cm$^3$/min. $H_2$, and 10 cm$^3$/min. $MoCl_5$.
Figure 5:
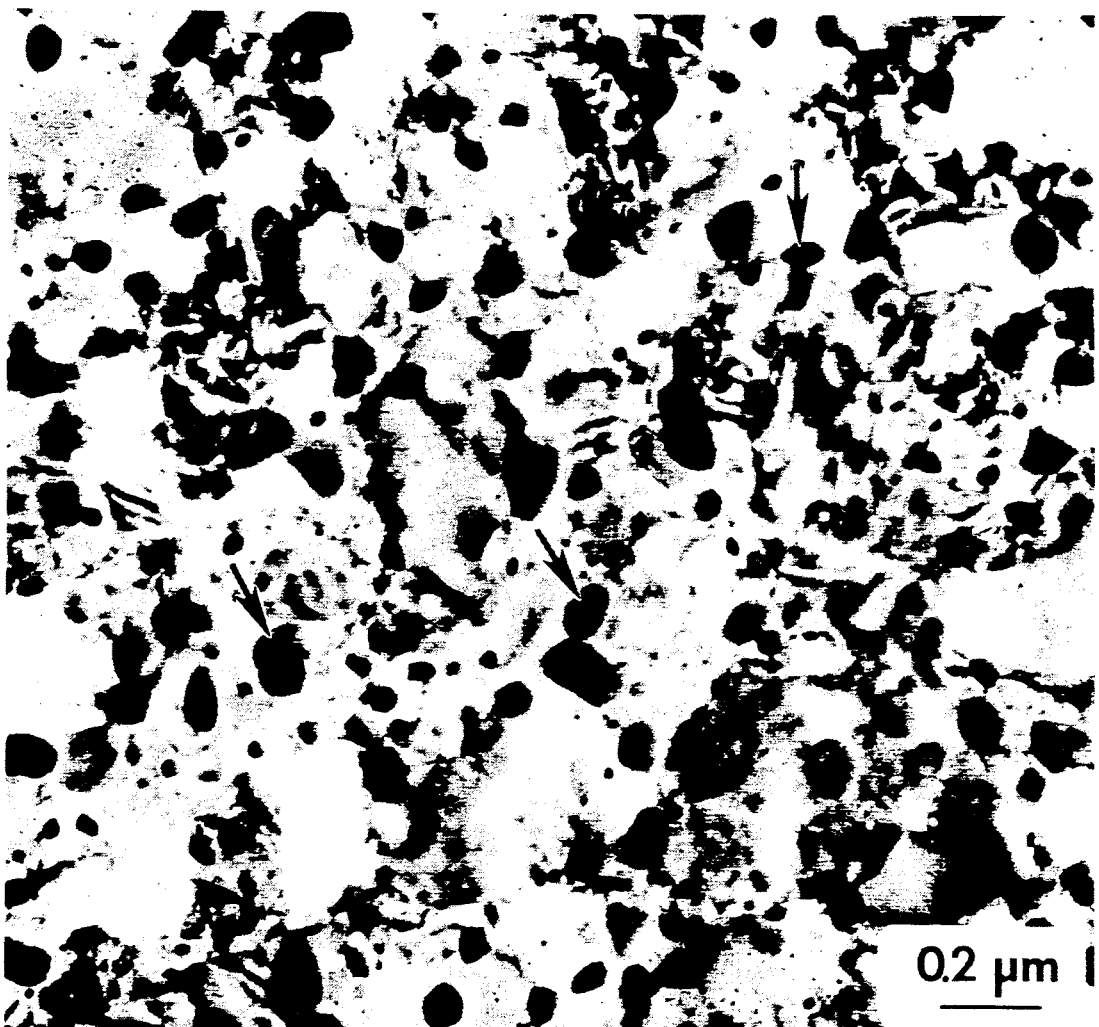
FIG. 5 is a transmission electron micrograph showing a coating deposited by the subject process. Small molybdenum silicide particles dispersed in a crystalline $\beta$-$Si_3N_4$ matrix are indicated by arrows.

A coating was deposited onto a graphite substrate as described in Example I, with an increased amount of molybdenum (10 cm$^2$/min. MoCl$_5$) added to the process. X-ray diffraction analysis (FIG. 4) and transmission electron microscopic analysis (FIG. 5) of the coating that was produced showed the deposit to be predominantly crystalline $\beta$-Si$_3$N$_4$ with a greater amount of the MoSi$_2$ second phase.

EXAMPLE III

Coatings were produced, as described above, on substrates such as graphite, carbon/carbon composite, silicon carbide, and other material. The composition of the coating was found to be highly controllable by varying the flows these reactants into the system. Coatings were deposited at temperatures ranging from about 1000° C. to 1200° C. and at pressures in the range of 2 kPa to 10 kPa. Higher concentrations of MoCl$_5$ resulted in an increase in the relative quantity of MoSi$_2$ phase. As more Mo containing reactant was added, a point was reached where only molybdenum silicides were deposited, with no evidence of Si$_3$N$_4$. Table I shows the various compositions of coatings produced in 28 CVD operations, carried out at a temperature of about 1150° C. and at a pressure of about 3.3 kPa, wherein the flow of reactants were varied widely. Samples 1-22 were coated onto graphite substrates, and samples 23-28 were coated onto carbon-carbon composite substrates. Deposition times were generally adjusted to produce a nominal layer thickness of 100-150 $\mu$m.

TABLE I

| Sample No. | Reactant flows (cm$^3$/min) | | | | XRD Composition |
|---|---|---|---|---|---|
| | SiCl$_4$ | MoCl$_5$ | NH$_3$ | H$_2$ | |
| 1 | 0.0 | 50.0 | 50.0 | 1175 | Mo, Mo$_2$N |
| 2 | 0.0 | 67.0 | 33.0 | 1626 | Mo |
| 3 | 80.0 | 10.0 | 10.0 | 1835 | MoSi$_2$ |
| 4 | 60.0 | 20.0 | 20.0 | 1670 | Mo, Mo$_3$Si, Mo$_5$Si$_3$ |
| 5 | 42.5 | 15.0 | 42.5 | 1161 | Mo$_5$Si$_3$, MoSi$_2$, Si$_3$N$_4$ |
| 6 | 33.0 | 33.0 | 33.0 | 1436 | MoSi$_2$, Si$_3$N$_4$, Mo$_5$Si$_3$ |
| 7 | 10.0 | 10.0 | 80.0 | 330 | Mo$_5$Si$_3$, MoSi$_2$, Mo$_3$Si |
| 8 | 20.0 | 20.0 | 60.0 | 810 | Mo$_3$Si, Mo$_5$Si$_3$ |
| 9 | 42.5 | 42.5 | 15.0 | 1890 | Mo$_3$Si, Mo$_5$Si$_3$, Mo |
| 10 | 15.0 | 42.5 | 42.5 | 1299 | Mo, Mo$_3$Si |
| 11 | 20.0 | 60.0 | 20.0 | 1870 | Mo, Mo$_3$Si |
| 12 | 10.0 | 80.0 | 10.0 | 2185 | Mo, Mo$_3$Si |
| 13 | 20.0 | 10.0 | 70.0 | 545 | Mo$_3$Si, Mo$_5$Si$_3$ |
| 14 | 10.0 | 20.0 | 70.0 | 595 | Mo, Mo$_3$Si |
| 15 | 80.0 | 10.0 | 10.0 | 1835 | Mo, Mo$_3$Si |
| 16 | 43.0 | 0.0 | 57.0 | 775 | $\alpha$-Si$_3$N$_4$, Si |
| 17 | 40.0 | 0.0 | 160.0 | 560 | Amorph. Si$_3$N$_4$ |
| 18 | 40.0 | 1.0 | 160.0 | 585 | $\alpha + \beta$-Si$_3$N$_4$, MoSi$_2$ |

TABLE I-continued

| Sample No. | Reactant flows (cm³/min) | | | XRD Composition |
|---|---|---|---|---|
| | SiCl₄ | MoCl₅ | NH₃ | H₂ |
| 19 | 40.0 | 2.5 | 160.0 | 625 α + β-Si₃N₄, MoSi₂ |
| 20 | 40.0 | 5.0 | 160.0 | 685 β-Si₃N₄, MoSi₂ |
| 21 | 40.0 | 10.0 | 160.0 | 750 β-Si₃N₄, MoSi₂ |
| 22 | 40.0 | 20.0 | 160.0 | 940 MoSi₂, Si₃N₄, Mo₅Si₃ |
| 23 | 20.0 | 0.0 | 80.0 | 280 Amorph. Si₃N₄ |
| 24 | 40.0 | 0.0 | 160.0 | 560 Amorph. Si₃N₄ |
| 25 | 40.0 | 1.0 | 160.0 | 585 α + β-Si₃N₄, MoSi₂ |
| 26 | 40.0 | 2.5 | 160.0 | 625 α + β-Si₃N₄, MoSi₂ |
| 27 | 40.0 | 5.0 | 160.0 | 685 β-Si₃N₄, MoSi₂ |
| 28 | 40.0 | 10.0 | 160.0 | 750 β-Si₃N₄, MoSi₂ |

EXAMPLE IV

A CVD coating was prepared as in Example I, with molybdenum hexafluoride (MoF₆) used as the molybdenum source. Additional SiCl₄ was needed to overcome the formation of SiF₄. The resulting coating was similar to that of Example I.

EXAMPLE V

A CVD coating was prepared as in Example I, with silane (SiH₄) used as the silicon source. The resulting coating was similar to that of Example I.

Other variations of the coatings may be fabricated using alternate reactant sources such as metal organic sources for the metals. Other vapor deposition techniques such as plasma- or microwave-enhanced CVD may also be employed to fabricate the materials.

An advantage derived from the subject process is that quality, crack-free, crystalline material can be deposited at much lower temperatures, broadening the applicable range of substrate materials. The oxidation resistance properties of the coating materials are also enhanced by the MoSi₂ additions. Molybdenum disilicide possesses exceptional oxidation resistance properties, and Si₃N₄ deposits with a dispersed MoSi₂ phase performed well in oxidation tests as shown in Example VI below.

EXAMPLE VI

An oxidation test comprising 12 to 15 cycles, simulating hypervelocity aircraft leading edge temperatures from about 900° C. to about 1400° C. in air, were performed on coated substrates prepared in accordance with the invention. The comparative results are shown in Table II.

TABLE II

| Composition | % Weight Change |
|---|---|
| SiC | −5.01 |
| Si₃N₄ | −2.53 |
| Si₃N₄ + MoSi₂ | −1.46 |
| Si₃N₄ + MoSi₂* | −1.45 |

*Higher MoSi₂ content

The new compositions described herein are useful for various applications, such as protective coatings for carbonaceous or other materials prone to oxidation/corrosion at elevated temperatures, coatings for ceramic or metal components, and certain military applications.

The invention is also useful in chemical vapor infiltration (CVI) processes and compositions. U.S. Pat. No. 4,580,524, Lackey, et al., describes a CVI process suitably adaptable to the present invention. The silicon nitride/molybdenum silicide composition is deposited on and about the fibers of a fibrous substrate, or on and about the external and internal surfaces of a porous, preformed substrate. Substrates need only withstand temperatures of about 1000° C. Thus, new composite materials can be made using substrates which cannot withstand the high temperatures necessary for other methods.

EXAMPLE VII

A porous, preformed article comprising Nicalon (tradename for a silicon/carbon/oxygen fiber available from Dow Corning, Midland, Mich.) is subjected to a silicon nitride CVI process wherein MoCl₅ is introduced at a rate in the range of less than 1% to about 5% of the total reactant flow. Crystalline silicon nitride/molybdenum silicide is infiltrated and deposited throughout the interstices of the article, resulting in a dense composite material having useful ambient and elevated temperature strength and modulus and greater toughness than typical monolithic ceramics.

A major advantage derived from the invention is that high quality, crack free, crystalline material can be deposited at much lower temperatures, broadening the applicable range of substrate materials.

The invention is useful for various applications, such as protective coatings for carbonaceous or other materials prone to oxidation/corrosion at elevated temperatures, coatings for ceramic or metal components. CVI composites prepared in accordance with the invention are useful for high temperature and stress applications such as jet engine components and high-temperature heat exchangers.

While there has been shown and described what are at present considered the preferred embodiments of the invention, it will be obvious to those skilled in the art that various changes and modifications can be made therein without departing from the scope of the inventions defined by the appended claims.

What is claimed is:

1. A method for chemical vapor deposition of crystalline silicon nitride comprising the steps of:
    introducing into a vessel a substrate;
    introducing into said vessel a thermally decomposable gaseous mixture comprising a silicon source, a molybdenum source, a nitrogen source, and hydrogen; and,
    thermally decomposing said gaseous mixture to deposit onto said substrate a coating comprising crystalline silicon nitride having a molybdenum silicide dispersed therein.

2. The method according to claim 1 wherein said silicon source comprises a composition selected from the group consisting of silanes, chlorosilanes, and silicon chlorides.

3. The method according to claim 2 wherein said silicon source comprises silicon tetrachloride.

4. The method according to claim 1 wherein said molybdenum source comprises a composition selected from the group consisting of molybdenum-containing organometallic composition and molybdenum halides.

5. The method according to claim 4 wherein said molybdenum source comprises molybdenum pentachloride.

6. The method according to claim 1 wherein said nitrogen source comprises ammonia.

7. The method according to claim 1 wherein said decomposing step is accomplished at a temperature in the range of about 1000° C. to about 1500° C.

8. The method according to claim 1 wherein said decomposing step is carried out at a temperature in the range of about 1200° C. to about 1400° C.

9. The method according to claim 1 wherein said crystalline nitride of silicon comprises $\beta$-Si$_3$N$_4$.

10. The method according to claim 1 wherein said substrate comprises a porous ceramic preform, and wherein said coating is deposited through said porous ceramic preform to produce a composite material.

* * * * *